United States Patent
Park et al.

(10) Patent No.: US 9,922,911 B1
(45) Date of Patent: Mar. 20, 2018

(54) POWER MODULE WITH DOUBLE-SIDED COOLING

(71) Applicants: Hyundai Motor Company, Seoul (KR); KIA Motors Corporation, Seoul (KR)

(72) Inventors: Jun Hee Park, Hwaseong-si (KR); Woo Yong Jeon, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/599,688

(22) Filed: May 19, 2017

(30) Foreign Application Priority Data

Nov. 9, 2016 (KR) ........................ 10-2016-0148687

(51) Int. Cl.
  *H01L 23/495* (2006.01)
  *H01L 23/373* (2006.01)
  *H01L 23/433* (2006.01)

(52) U.S. Cl.
  CPC .... *H01L 23/49568* (2013.01); *H01L 23/3735* (2013.01); *H01L 23/4334* (2013.01); *H01L 23/373* (2013.01); *H01L 23/495* (2013.01); *H01L 2224/32245* (2013.01); *H01L 2924/1305* (2013.01); *H01L 2924/13055* (2013.01)

(58) Field of Classification Search
  CPC ........... H01L 23/49568; H01L 23/4334; H01L 23/3735; H01L 23/495; H01L 23/373
  See application file for complete search history.

(56) References Cited

U.S. PATENT DOCUMENTS

| | | | |
|---|---|---|---|
| 7,262,444 B2 | 8/2007 | Fillion et al. | |
| 8,063,440 B2 * | 11/2011 | Yankoski | H01L 25/18 257/330 |
| 8,654,541 B2 * | 2/2014 | Robert | H01L 23/3735 361/760 |
| 9,041,183 B2 * | 5/2015 | Liang | H01L 25/072 257/691 |

FOREIGN PATENT DOCUMENTS

| | | |
|---|---|---|
| JP | 2004111431 A | 4/2004 |
| KR | 101434039 B1 | 8/2014 |

\* cited by examiner

*Primary Examiner* — William Coleman
(74) *Attorney, Agent, or Firm* — McDonnell Boehnen Hulbert & Berghoff LLP

(57) ABSTRACT

Disclosed is a power module with double-sided cooling, comprising a semiconductor chip disposed between an upper substrate and a lower substrate; a first power lead disposed between the upper substrate and the semiconductor chip; a signal lead disposed between the upper substrate and the semiconductor chip, and spaced apart from the first power lead; a second power lead disposed between the lower substrate and the semiconductor chip; and a separation plate disposed between the first power lead, the signal lead, and the semiconductor chip; wherein the separation plate connects the first power lead with the semiconductor chip via a first hole formed through the separation plate, and connects the signal lead and the semiconductor chip via a second hole formed through the separation plate.

9 Claims, 4 Drawing Sheets

[Fig.1]
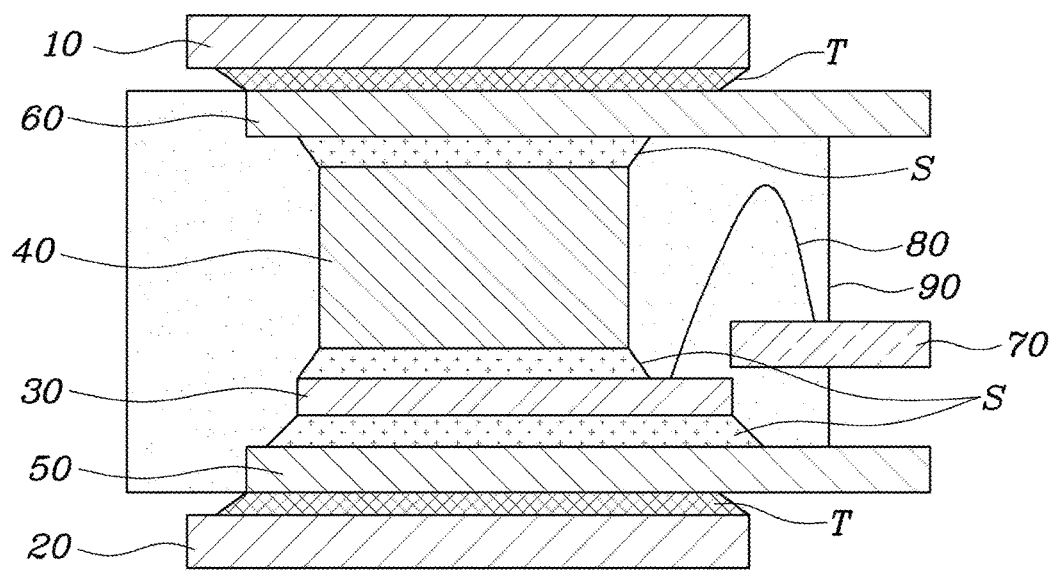

[Fig.2]
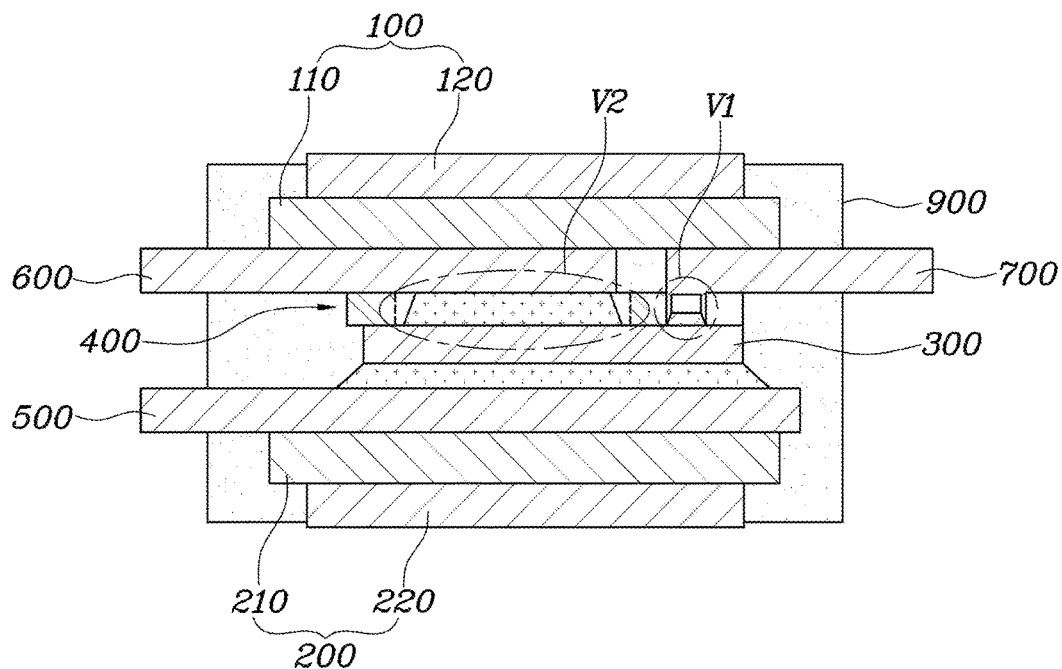
[Fig.3]
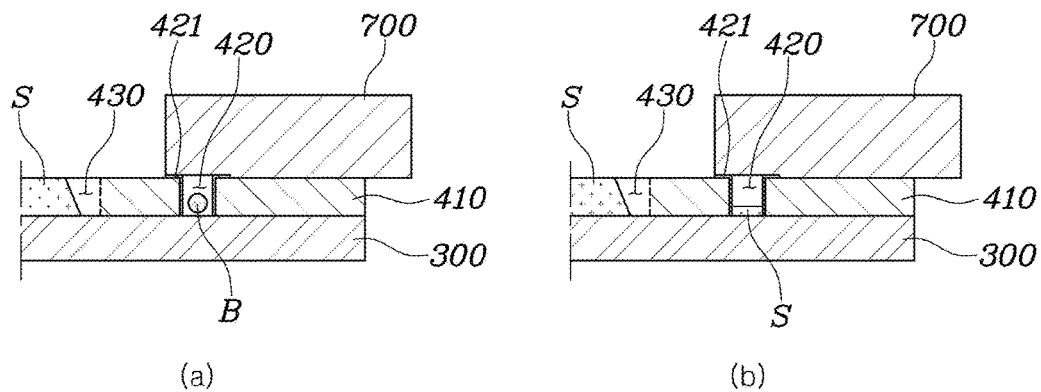
(a)          (b)

[Fig.4]
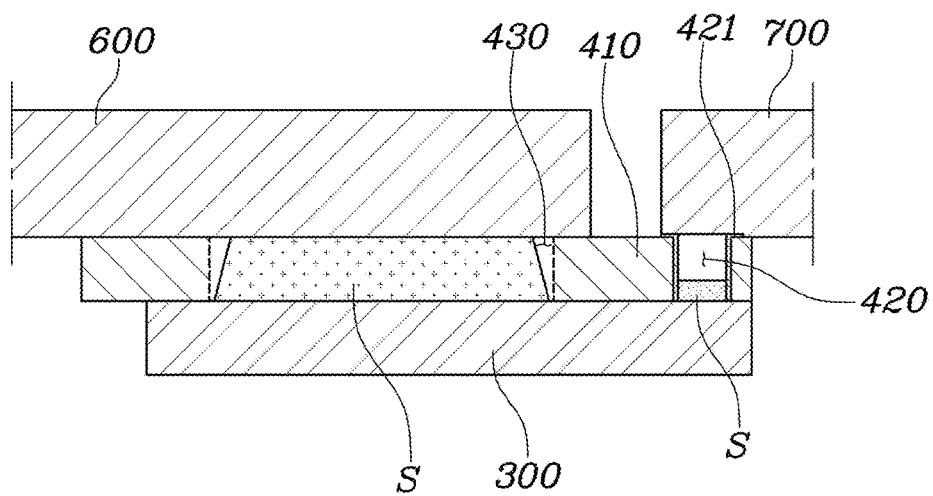

[Fig.5]
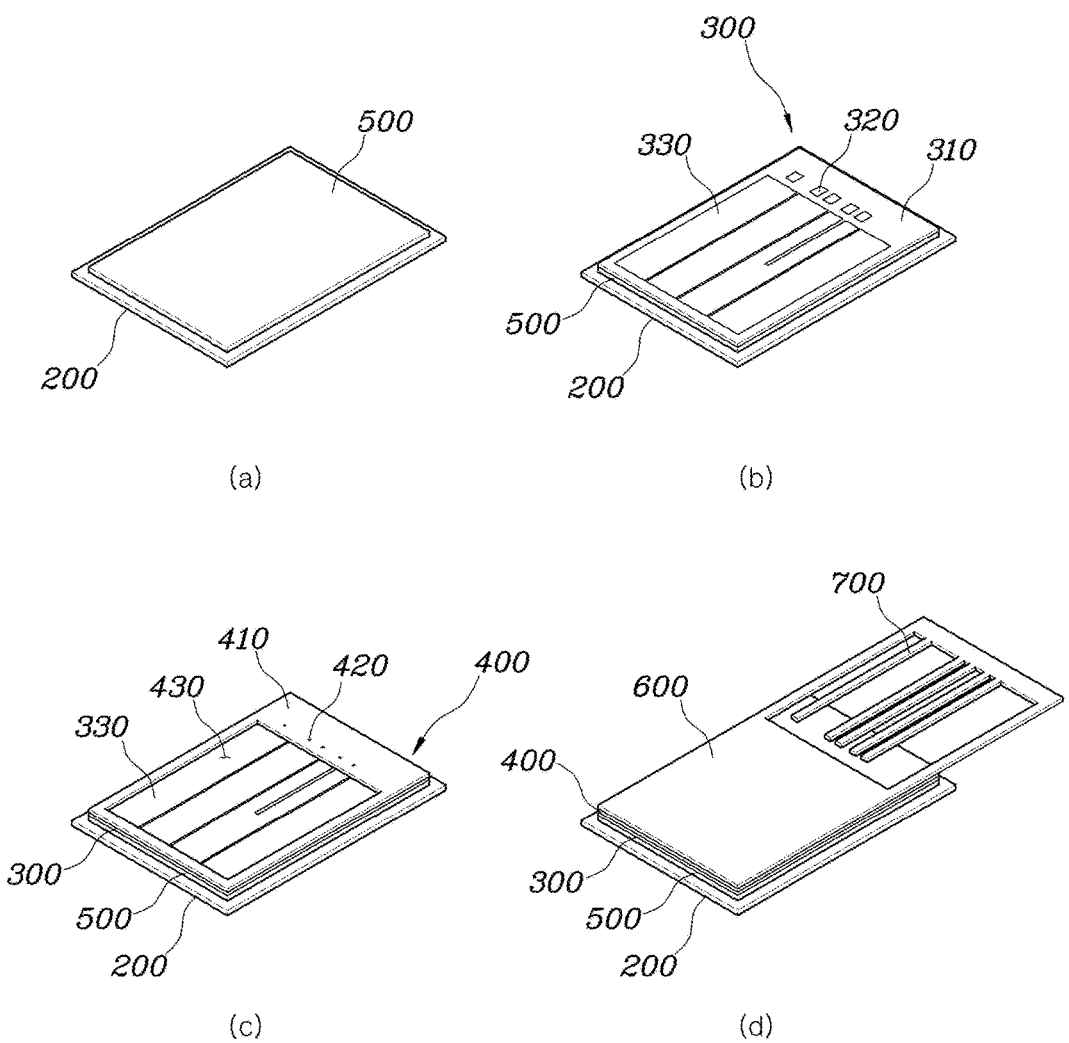

POWER MODULE WITH DOUBLE-SIDED COOLING

CROSS REFERENCE TO RELATED APPLICATION

The present application claims benefit of and priority to Korean Patent Application No. 10-2016-0148687, filed on Nov. 9, 2016, the entire contents of which is incorporated herein for all purposes by this reference.

BACKGROUND

Technical Field

The present disclosure relates generally to a power module with double-sided cooling. More particularly, the present disclosure relates to a power module with double-sided cooling, in which a semiconductor chip is provided between an upper substrate and a lower substrate.

Description of the Related Art

Generally, a hybrid power control unit ("HPCU") (an inverter) is a component used for eco-friendly vehicles (hybrid vehicles/electric vehicles). Because a power module accounts for most of the cost of the components constituting the HPCU, research and development has been actively conducted to achieve high power, miniaturization, and cost reduction.

As shown in FIG. 1, a power module with double-sided cooling is configured such that a semiconductor chip 30 comprising insulated gate bipolar transistors (IGBTs) and diodes is disposed between an upper substrate 10 and a lower substrate 20, and a cooler (not shown) provided outside the upper and lower substrates removes heat generated by the semiconductor chip 30. Due to this configuration, it is possible to reduce the size of the power module and to improve cooling performance.

However, in the conventional power module, the semiconductor chip 30 may be provided with a spacer 40 to secure a space for a wire 80 that transmits and receives an operation signal, wherein to minimize the difference in thermal expansion rates between spacer 40 and upper and lower substrates 10 and 20, and to maintain high thermal conductivity, an expensive material, such as aluminum-silicon carbide ("Al—SiC"), copper-molybdenum ("Cu—Mo"), etc., is used, thereby increasing the cost of the power module.

Accordingly, to reduce cost in the conventional power module, the material of spacer 40 can be replaced with copper ("Cu"). However, there is a large difference in thermal expansion rates between Cu and semiconductor chip 30, causing decreased durability and potentially damage due to thermal stress.

Further, the conventional power module requires a process for attaching semiconductor chip 30 to a signal lead 70 using wire 80. In detail, the conventional process is divided into three steps: a first soldering process for soldering lower substrate 10 and semiconductor chip 30 using a solder material S; a bonding process for bonding semiconductor chip 30 and wire 80; and a second soldering process for soldering semiconductor chip 30, spacer 40, and upper substrate 10 using the solder material. These processes may lower productivity by increasing the complexity of the manufacturing process.

Thus, a new power module that can be manufactured at low cost using a simple manufacturing process, that has no problems caused by thermal stress, and that requires no spacer is required.

The foregoing is intended merely to aid in the understanding of the background of the present disclosure, and is not intended to mean that the present disclosure falls within the purview of the related art that is already known to those skilled in the art.

SUMMARY OF THE DISCLOSURE

The present disclosure addresses the above problems occurring in the related art by providing a power module with double-sided cooling, which can be manufactured at low cost using a simple manufacturing process, has no problems caused by thermal stress, and requires no spacer.

In order to achieve the above object, according to one aspect of the present disclosure, there is provided a power module with double-sided cooling having a semiconductor chip provided between an upper substrate and a lower substrate, the power module including: a first power lead provided between the upper substrate and the semiconductor chip; a signal lead provided between the upper substrate and the semiconductor chip, and spaced apart from the first power lead; a second power lead provided between the lower substrate and the semiconductor chip; and a separation plate provided among the first power lead, the signal lead, and the semiconductor chip, connecting the first power lead with the semiconductor chip via a first hole formed through the separation plate, and connecting the signal lead and the semiconductor chip via a second hole formed through the separation plate.

An inner circumferential surface of the second hole provided in the separation plate may be provided with a conductive layer made of a conductive material.

The conductive layer may be a copper plating layer.

The conductive layer may have a thickness of from about 1 to about 10 μm.

The conductive layer may extend from the inner circumferential surface of the second hole to a top surface of the separation plate.

A lower portion of the second hole provided in the separation plate may be filled with a solder material to connect the conductive layer with the semiconductor chip.

The first hole provided in the separation plate may be filled with a solder material to connect the first and second power leads with the semiconductor chip.

The separation plate may have a thickness of from about 100 to about 200 μm.

The separation plate may be made of a dielectric material or a ceramic material

The power module with double-sided cooling according to the present disclosure has the following advantageous characteristics.

First, it is possible to reduce the cost and size of the power module by eliminating the spacer.

Second, it is possible to improve production rates for the power module by simplifying the assembly process.

Third, it is possible to improve the durability of the power module by minimizing soldering joints.

Fourth, it is possible to improve thermal durability of the power module by minimizing the difference in expansion rates between the components of the power module.

BRIEF DESCRIPTION OF THE DRAWINGS

The above and other objects, features and other advantages of the present disclosure will be more clearly under- FIG. 1 is a sectional view showing a conventional power module with double-sided cooling;

FIG. 2 is a sectional view showing a power module with double-sided cooling according to an example embodiment of the present disclosure;

FIG. 3 is an enlarged sectional view of section V1 of FIG. 2;

FIG. 4 is an enlarged sectional view of section V2 of FIG. 2; and

FIG. 5 is a view showing an assembly process for a power module with double-sided cooling according to an example embodiment of the present disclosure.

DETAILED DESCRIPTION

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and will not be interpreted in an idealized or overly formal sense unless expressly so defined herein.

Hereinbelow, an example embodiment of the present disclosure is described in detail with reference to the accompanying drawings. Throughout the drawings, the same reference numerals will refer to the same or like parts.

As shown in FIGS. 2 and 5, a power module with double-sided cooling according to the present disclosure includes: an upper substrate 100 comprising an upper base layer 110 and an upper metal layer 120; a lower substrate 200 comprising a lower base layer 210 and a lower metal layer 220; and a semiconductor chip 300 provided between upper substrate 100 and lower substrate 200.

A lower surface of upper base layer 110 interfaces with a first power lead 600 that transmits and receives high-voltage current by being connected to the semiconductor chip 300, and interfaces with a signal lead 700 that transmits and receives an operation signal by being connected to the semiconductor chip 300, wherein first power lead 600 and signal lead 700 are spaced apart from each other so as not to be conductive to each other. Meanwhile, an upper surface of the lower base layer 210 interfaces with a second power lead 500 that transmits and receives high-voltage current by being connected to the semiconductor chip 300.

Semiconductor chip 300 may be connected to first power lead 600, second power lead 500, and signal lead 700, respectively. Because a soldering structure connected to second power lead 500 is similar to a conventional power module with double-sided cooling, a detailed description thereof will be omitted herein.

In an example embodiment of the present disclosure, the spacer and wire required in conventional power modules are eliminated, making it possible to provide a power module with double-sided cooling that is smaller than a conventional power module.

To achieve this, a separation plate 400 is disposed between first power lead 600, signal lead 700, and semiconductor chip 300. Separation plate 400 is disposed in the same location as the conventional spacer, but the separation plate has a thickness of from about 50 to about 200 μm, which is thinner than a conventional spacer that has a thickness of about 1 mm.

In a further example embodiment, separation plate 400 is made of an organic material, such as a polychlorinated biphenyl ("PCB") that facilitates making a through-hole, an organic-inorganic hybrid material having improved insulation properties and improved thermal properties, or a ceramic material, such as low temperature co-fired ceramic ("LTCC"). If separation plate 400 has a thickness less than 50 μm, insulation performance is diminished. On the other hand, if separation plate 400 has a thickness greater than 200 μm, it is difficult to perform soldering for a first hole 430.

As shown in FIG. 4, a frame 410, which is the main body of separation plate 400, is provided with a first hole 430 and a second hole 420, wherein semiconductor chip 300 and first power lead 600 are connected via first hole 430, and semiconductor chip 300 and signal lead 700 are connected via second hole 420.

As shown in FIGS. 3 and 5, first hole 430 is configured in a shape corresponding to the shape of a power pad 330 that is disposed on a main body 310 of semiconductor chip 300, and a solder material S is inserted into the first hole such that power pad 330 and first power lead 600 are electrically and thermally connected.

First hole 430 may be configured such that a plurality of power pads 330 may be connected to first power lead 600. Alternatively, there may be a plurality of first holes 430, each first hole having a power pad 330 disposed therein.

As shown in FIGS. 4 and 5, there may also be a plurality of second holes 420 is formed in frame 410 of separation plate 400, wherein each second hole 420 is disposed at a location corresponding to each of a plurality of signal pads 320 disposed on main body 310 of semiconductor chip 300.

Conventionally, signal pad 320 and signal lead 700 are attached to each other using a wire. However, in the present disclosure, signal pad 320 and signal lead 700 are disposed on top of the other, and then connected via second hole 420.

While the size of second hole 420 is not limited to a predetermined size, the diameter of second hole 420 may be form about 100 to about 300 μm to correspond to the size of signal pad 320.

As shown in FIG. 3, an inner circumferential surface of second hole 420 disposed in separation plate 400 may be provided with a conductive layer 421 made of a conductive material. Conductive layer 421 is provided for electrically connecting signal pad 320 with signal lead 700. In a example embodiment, conductive layer 421 is a copper plating layer having a thickness of from about 1 to about 10 μm.

If conductive layer 421 has a thickness less than 1 μm, the connection between signal pad 320 and signal lead 700 may be unstable; on the other hand, if conductive layer 421 has a thickness greater than 10 μm, stress caused by the difference in thermal expansion rate between the conductive layer 421 and frame 410 may damage the power module.

It is preferred that conductive layer 421 is disposed not only in the inner circumferential surface of second hole 420, but also extending from an upper portion of second hole 420 to a top surface of frame 410 of separation plate 400. In other words, a periphery of the upper portion of second hole 420 is provided with conductive layer 421 such that contact between conductive layer 421 and signal lead 700 is converted from a line contact to a surface contact, making it possible to effectively maintain contact between conductive layer 421 and signal lead 700.

If second hole 420 is filled with copper instead of being provided with a thin layer, such as conductive layer 421, connection with other components of the power module may be broken or cracking may occur, due to the thermal expansion rate difference between separation plate 400 and the copper.

A lower portion of second hole 420 may be filled with a solder material S to create a connection between conductive layer 421 and signal pad 320 of semiconductor chip 300. While the entire second hole 420 may be filled with the solder material S, at least the lower portion of second hole 420 should be filled with the solder material so as to fill a gap between signal pad 320 and conductive layer 421. In this way, it is possible to connect conductive layer 421 with signal pad 320 using minimal solder material S.

Hereinafter, reference is made to an assembly process of the present disclosure, with reference with FIGS. 2, 4, and 5.

The present disclosure is configured to sequentially layer lower substrate 200, second power lead 500, semiconductor chip 300, separation plate 400, first power lead 600, signal lead 700, and upper substrate 100. Herein, upper substrate 100 is omitted in FIG. 5.

When layering the various power module components as described above, the solder material S is inserted between second power lead 500 and semiconductor chip 300, and between semiconductor chip 300 and first power lead 600, and, as shown in FIG. 3(a), a solder ball B is inserted into second hole 420, in advance. Here, the solder ball B is made by processing a conventional solder material S to be a ball shape.

Next, upper substrate 100 and lower substrate 200 are pressed and heated, and the solder material S and the solder ball B are melted to bond each component.

As described above, because the present disclosure requires one layering and one heating process, (i.e. requires only a soldering process), assembly time is reduced compared to the conventional module that requires two layering processes, two soldering processes and one wire bonding process, thereby improving production rates.

After the soldering process, first power lead 600 and signal lead 700, which are initially integrally formed, are cut to form the space that prevents contact and conductivity between first power lead 600 and signal lead 700, and the components between the upper substrate and the lower substrate are wrapped by using an envelope 900 to complete manufacturing of the power module.

Although preferred embodiments of the present disclosure has been described for illustrative purposes, those skilled in the art will appreciate that various modifications, additions and substitutions are possible, without departing from the scope and spirit of the invention.

The above described embodiments are therefore illustrative and not restrictive, because the scope of the disclosure is defined by the appended claims rather than by the description preceding them, and all changes that fall within metes and bounds of the claims, or equivalence of such metes and bounds are therefore intended to be embraced by the claims.

[Description of reference characters of important parts]

| | |
|---|---|
| 10: upper substrate | 20: lower substrate |
| 30: semiconductor chip | 40: spacer |
| 50, 60: power lead | 70: signal lead |
| 80: wire | 90: envelope |
| 100: upper substrate | 110: upper base layer |
| 120: upper metal layer | 200: lower substrate |
| 210: lower base layer | 220: lower metal layer |
| 300: semiconductor chip | 310: main body |
| 320: signal pad | 330: power pad |
| 400: separation plate | 410: frame |
| 420: first hole | 421: conductive layer |
| 430: second hole | 500: second power lead |
| 600: first power lead | 700: signal lead |
| 900: envelope | T: heat conductive material |
| B: solder ball | S: solder material |

What is claimed is:

1. A power module with double-sided cooling, comprising:
    a semiconductor chip disposed between an upper substrate and a lower substrate;
    a first power lead disposed between the upper substrate and the semiconductor chip;
    a signal lead disposed between the upper substrate and the semiconductor chip, and spaced apart from the first power lead;
    a second power lead disposed between the lower substrate and the semiconductor chip; and
    a separation plate disposed between the first power lead, the signal lead, and the semiconductor chip, wherein
    the separation plate connects the first power lead with the semiconductor chip via a first hole formed through the separation plate, and connects the signal lead and the semiconductor chip via a second hole formed through the separation plate.

2. The power module of claim 1, wherein
an inner circumferential surface of the second hole disposed in the separation plate is coated with a conductive layer.

3. The power module of claim 1, wherein
the first hole provided in the separation plate is filled with a solder material to connect the first and second power leads with the semiconductor chip.

4. The power module of claim 1, wherein
the separation plate has a thickness of from about 100 to about 200 μm.

5. The power module of claim 1, wherein
the separation plate is made of a dielectric material or a ceramic material.

6. The power module of claim 2, wherein
the conductive layer is a copper plating layer.

7. The power module of claim 2, wherein
the conductive layer has a thickness of from about 1 to about 10 μm.

8. The power module of claim 2, wherein
the conductive layer extends from the inner circumferential surface of the second hole to a top surface of the separation plate.

9. The power module of claim 2, wherein
a lower portion of the second hole disposed in the separation plate is filled with a solder material to connect the conductive layer with the semiconductor chip.

* * * * *